(12) United States Patent
de Raad et al.

(10) Patent No.: US 12,021,077 B2
(45) Date of Patent: Jun. 25, 2024

(54) CROSS-DOMAIN ELECTROSTATIC DISCHARGE PROTECTION

(71) Applicant: NXP B.V., Eindhoven (NL)

(72) Inventors: Gijs Jan de Raad, Bemmel (NL); Mikhail Yurievich Semenov, Zelenograd (RU); Yury Vladimirovich Alymov, Zelenograd (RU); Elena Valentinovna Somova, Solnechnogorsk (RU)

(73) Assignee: NXP, B.V., Eindhoven (NL)

( * ) Notice: Subject to any disclaimer, the term of this patent is extended or adjusted under 35 U.S.C. 154(b) by 0 days.

(21) Appl. No.: 18/166,860

(22) Filed: Feb. 9, 2023

(65) Prior Publication Data
US 2023/0282637 A1    Sep. 7, 2023

(30) Foreign Application Priority Data

Mar. 1, 2022   (RU) .......................... RU2022105515

(51) Int. Cl.
*H01L 27/02* (2006.01)
*H02H 9/04* (2006.01)

(52) U.S. Cl.
CPC ...... *H01L 27/0281* (2013.01); *H01L 27/0255* (2013.01); *H01L 27/0288* (2013.01); *H01L 27/0296* (2013.01); *H02H 9/045* (2013.01)

(58) Field of Classification Search
CPC ............. H01L 27/0281; H01L 27/0255; H01L 27/2288; H02H 9/045
See application file for complete search history.

(56) References Cited

U.S. PATENT DOCUMENTS

| | | | |
|---|---|---|---|
| 5,946,175 A * | 8/1999 | Yu | H03K 17/08122 361/58 |
| 8,525,265 B2 | 9/2013 | Ker et al. | |
| 8,570,698 B2 | 10/2013 | Lee et al. | |
| 9,035,393 B2 | 5/2015 | Ma et al. | |
| 9,236,372 B2 | 1/2016 | Stockinger | |
| 10,141,301 B2 | 11/2018 | Lai et al. | |
| 2006/0259892 A1* | 11/2006 | McGrath | H01L 27/0251 700/121 |
| 2008/0218920 A1* | 9/2008 | Vanysacker | H01L 27/0251 361/56 |
| 2009/0027059 A1* | 1/2009 | Arguello | G01R 31/31717 324/537 |
| 2012/0139607 A1 | 6/2012 | Ilzuka et al. | |
| 2018/0358969 A1 | 12/2018 | Davies et al. | |

FOREIGN PATENT DOCUMENTS

KR       20000066273 A       11/2000

* cited by examiner

*Primary Examiner* — Scott Bauer
(74) *Attorney, Agent, or Firm* — Jonathan J. Sapan

(57) ABSTRACT

Electrostatic discharge protection circuitry includes a transistor pass-gate coupled between potential source of electrostatic discharge-driven current ("ESD current") and an input node of a circuit block is configured provide a sufficiently resistive current path between a first current terminal and a second current terminal of the pass gate such that, when an amount of charge sufficient to cause an ESD event accumulates at the potential ESD current source, a sufficient voltage drop occurs across the pass gate such that devices coupled to the input node of the circuit block are protected from experiencing a voltage drop across them that is above a predetermined threshold voltage.

20 Claims, 6 Drawing Sheets

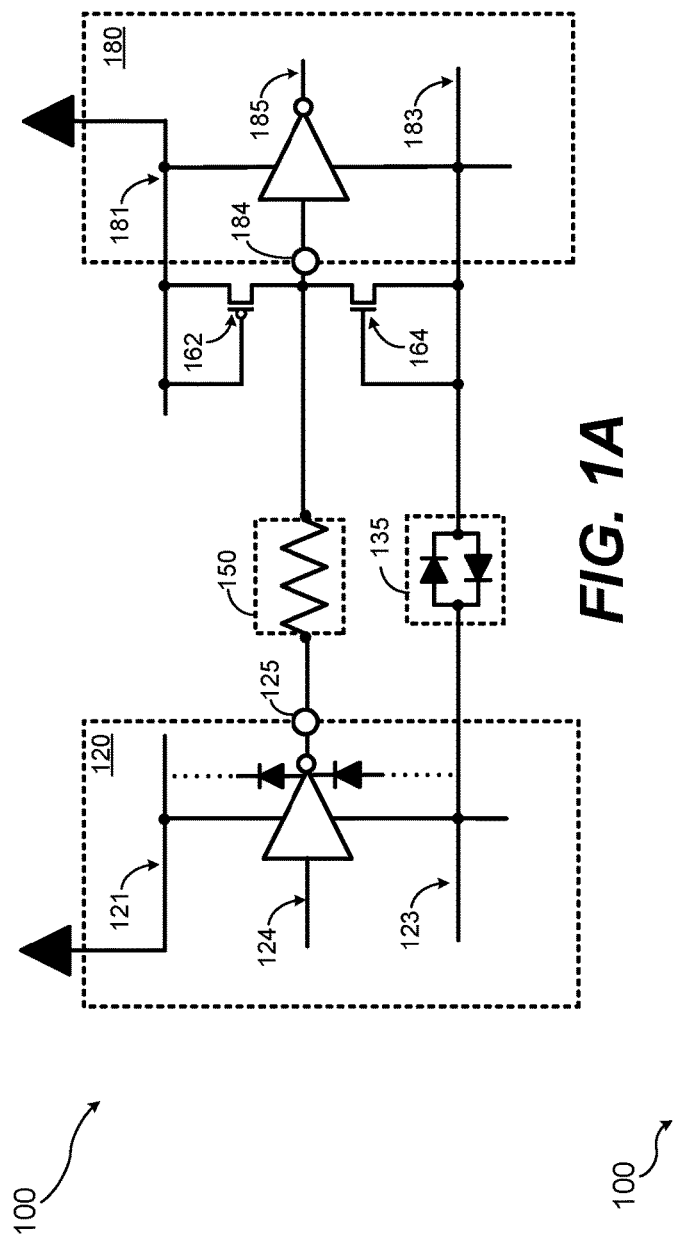
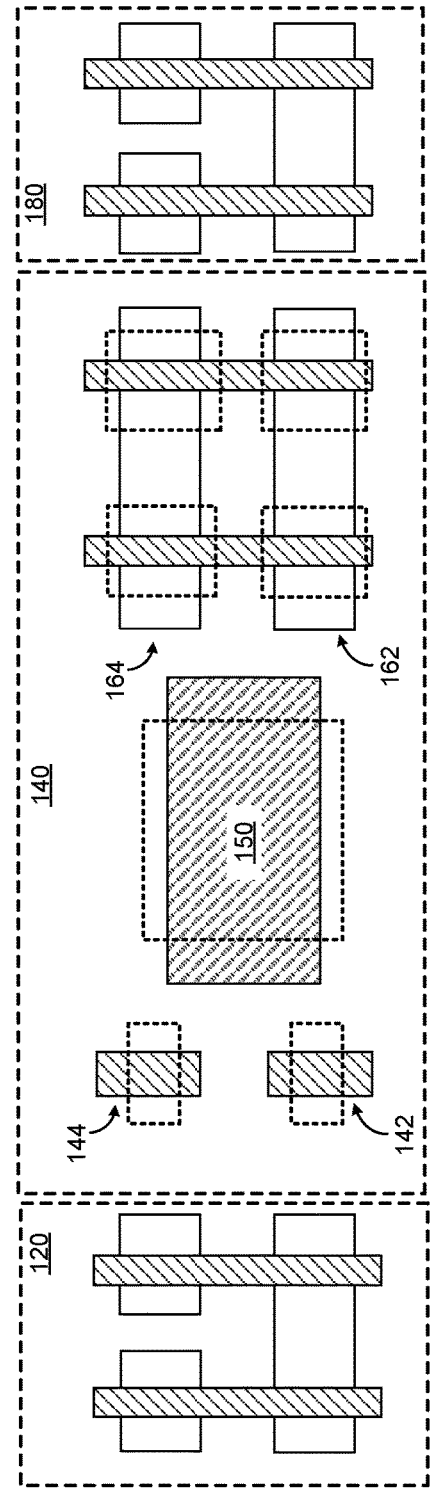
FIG. 1A
FIG. 1B

CROSS-DOMAIN ELECTROSTATIC DISCHARGE PROTECTION

CROSS-REFERENCE TO RELATED APPLICATIONS

This application claims the priority under 35 U.S.C. § 119 of Russian patent application no. 2022105515, filed Mar. 1, 2022 the contents of which are incorporated by reference herein.

FIELD OF THE INVENTION

Embodiments of the subject matter described herein relate to circuit elements that protect electronic circuits from damage caused by electrostatic discharges.

BACKGROUND OF THE INVENTION

Integrated circuits that include transistors and other electronic devices are often susceptible to physical damage caused by electrostatic discharge (ESD) events. ESD events can originate from external sources such as handling by people and machines which have become electrostatically charged. ESD events can also arise from charge accumulation within an integrated circuit, explained by a charged device model ("CDM type" ESD events). Some integrated circuits include multiple reference voltage nodes that are separated from each other to provide multiple reference domains ("ground domains"). Such integrated circuits may include interconnected circuit blocks that belong to different ground domains. Such circuit blocks may have varying resistance to CDM-type ESD events originating from circuit blocks belonging to other ground domains.

ICs with multiple ground domains often have protection circuits coupled to internal signal lines that connect devices in one ground domain to devices in another ground domain. A "CDM clamp" is a sub-circuit designed to dissipate CDM-type ESD-driven currents that may arise from charge accumulation at internal signal lines. CDM clamps often include a resistor connected in series between an output node of a device that may become the origin of an ESD event and the input node of another device. Such resistors are in turn coupled to devices such as transistors or diodes configured to safely dissipate currents driven by CDM-type ESD events.

SUMMARY OF THE INVENTION

In an example embodiment, a semiconductor device is provided. The semiconductor device includes a semiconductor substrate, a first circuit block formed within the semiconductor substrate and a second circuit block formed within the semiconductor substrate. The first circuit block has an output node and includes first electronic devices coupled to a first supply voltage node formed within the semiconductor substrate and a first reference voltage node formed within the semiconductor substrate. The second circuit block has an input node coupled to the output node of the first circuit block and includes second electronic devices coupled to a second supply voltage node formed within the semiconductor substrate and a second reference voltage node formed within the semiconductor substrate that is separated from the first reference voltage node.

The device also includes a transistor pass gate formed within the semiconductor substrate having first and second current terminals. The pass gate is coupled between the output node of the first circuit block and the input node of the second circuit block. The first current terminal of the pass gate is coupled to the output node of the first circuit block and the second current terminal of the pass gate is coupled to the input node of the second circuit block.

The pass gate is configured to provide a resistive path between the first current terminal and the second current terminal such that, when an amount of charge sufficient to cause an electrostatic discharge (ESD) event accumulates at the output node of the first circuit block, an electric potential difference between the input node of the second circuit block and the second reference voltage node of the second circuit block does not exceed a first predetermined threshold voltage.

In another example embodiment, a method of fabricating a semiconductor device is provided. The method includes forming a transistor pass gate within a semiconductor substrate. The pass gate has first and second current terminals. The method further includes electrically coupling the first current terminal of the pass gate to an output node of a first circuit block formed within the semiconductor substrate; electrically coupling the second current terminal of the pass gate to the input node of a second circuit block formed within the semiconductor substrate.

The first circuit block includes first electronic devices coupled to a first supply voltage node formed within the semiconductor substrate and a first reference voltage node formed within the semiconductor substrate. The input node of the second circuit block is coupled to the output node of the first circuit block via the pass gate.

The second circuit block includes second electronic devices coupled to a second supply voltage node formed within the semiconductor substrate and a second reference voltage node formed within the semiconductor substrate that is separated from the first reference voltage node.

The pass gate is configured to provide a resistive path between the first current terminal and the second current terminal such that, when an amount of charge sufficient to cause an electrostatic discharge (ESD) event accumulates at the output node of the first circuit block, an electric potential difference between the input node of the second circuit block and the second reference voltage node of the second circuit block does not exceed a first predetermined threshold voltage.

BRIEF DESCRIPTION OF THE DRAWINGS

The present disclosure is illustrated by way of examples, embodiments and the like and is not limited by the accompanying figures, in which like reference numbers indicate similar elements. Elements in the figures are illustrated for simplicity and clarity and have not necessarily been drawn to scale. The figures along with the detailed description are incorporated and form part of the specification and serve to further illustrate examples, embodiments and the like, and explain various principles and advantages, in accordance with the present disclosure, wherein:

FIG. 1A shows a circuit diagram of an example integrated circuit that includes CDM clamp circuitry that includes a resistor connected between an output node of a first circuit block and an input node of second circuit block.

FIG. 1B shows a schematic plan view illustration of the integrated circuit of FIG. 1A.

DETAILED DESCRIPTION

Figure 2A:
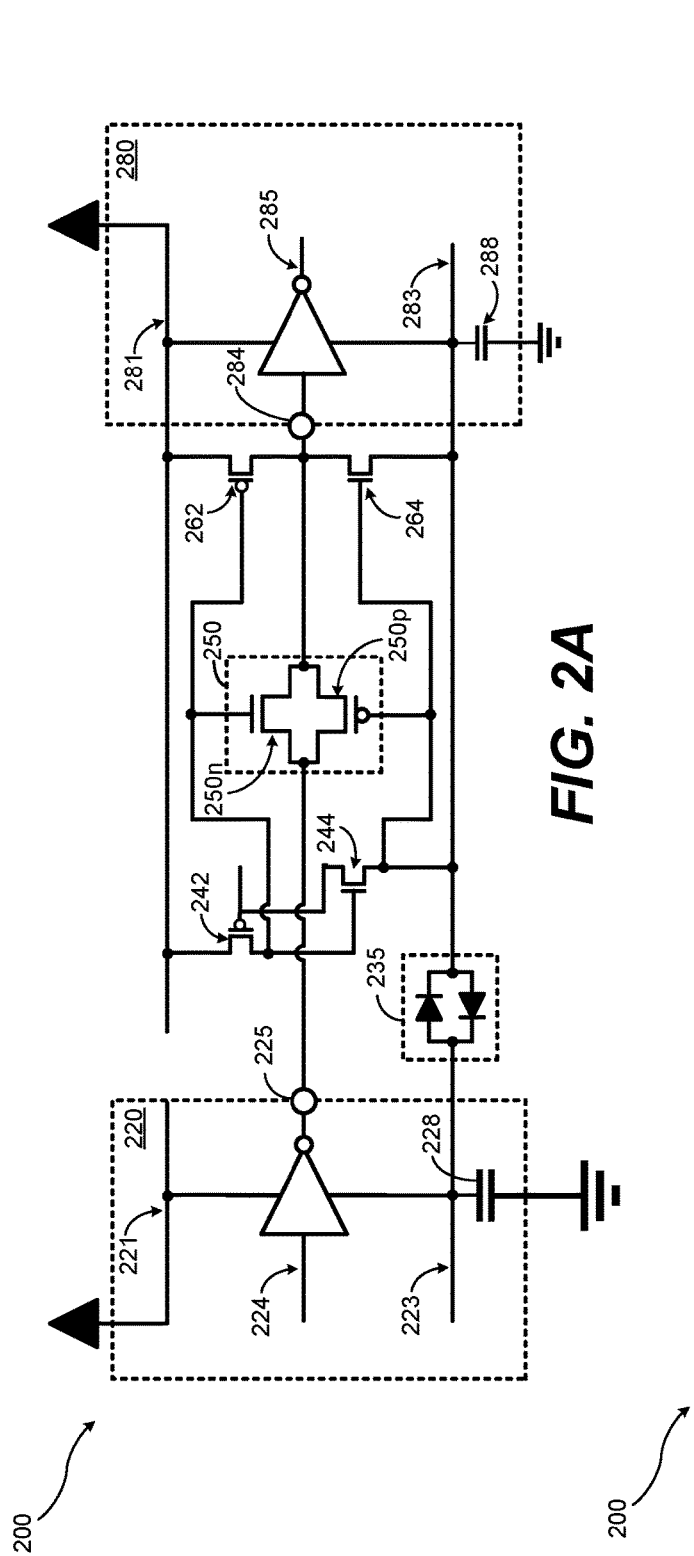
FIG. 2A shows a circuit diagram of an example IC in which CDM clamp circuitry that includes a transistor pass-gate connected between an output node of a first circuit block and an input node of second circuit block according to embodiments herein.

The following detailed description provides examples for the purposes of understanding and is not intended to limit the invention or the application and uses of the same. Furthermore, there is no intention to be bound by any expressed or implied theory presented in the preceding technical field, background, or the following detailed description.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements but may include other elements not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

Directional references such as "top," "bottom," "left," "right," "above," "below," and so forth, unless otherwise stated, are not intended to require any preferred orientation and are made with reference to the orientation of the corresponding figure or figures for purposes of illustration.

It will be appreciated that the steps of various processes described herein are non-limiting examples of suitable processes according to embodiments and are for the purposes of illustration. Systems and devices according to embodiments herein may use any suitable processes including those that omit steps described herein, perform those steps and similar steps in different orders, and the like. It will also be appreciated that well-known steps or other well-known process features may be omitted for clarity.

Some integrated circuits (ICs) have more than one ground and/or supply domain. FIG. 1A shows a simplified circuit schematic of an example IC 100 that includes two circuit blocks, a circuit block 120 and a circuit block 180, each represented by an inverter having an input node and an output node (the input node 124 and output node 125 of circuit block 120 and the input node 184 and output node 185 of circuit block 180). Each circuit block has a supply voltage line (the supply voltage line 121 and the supply voltage line 181) and a reference voltage line (the reference voltage line 123 and the reference voltage line 183). In this example, the reference voltage line 123 and the reference voltage line 183 are coupled to separate ground domains. Although different supply domains in circuits such as the example IC 100 are usually separated from each other (i.e., they are not directly interconnected such that they are electrically shorted to each other), the ground domains are often linked via anti-parallel diodes, (e.g., the antiparallel diodes 135 of FIG. 1A) and may have varying degrees of capacitive coupling to each other.

During a CDM-type ESD event, a transient voltage drop may develop across one of the antiparallel diodes 135. For example, the output node 125 of the circuit block 120 may become charged. If no specific design measures were taken (i.e., if the resistor 150 were absent) the charge accumulation at the output node 125 might result in a voltage at the input node 184 of the circuit block 180 large enough to induce a voltage drop across the gate dielectric of one or more transistor gates coupled to the input node 184 of the circuit block 180 likely to cause irreversible breakdown of the gate dielectric, resulting in permanent damage to the circuit block 180.

The ESD endurance of a device may be measured and characterized with reference an ESD model, of which charged device models (CDM) are examples. A device-under-test (DUT) such as the circuit block 180 according to embodiments herein may be characterized by a voltage applied in accordance with a suitable CDM model any other suitable model or a corresponding peak current level experienced by the DUT that is expected to result from the application of such a voltage. The ESD endurance may also be characterized by a voltage experienced at the input node 184 of the circuit block 180 when a particular charge is accumulated at the output node 125 of the circuit block 120 (or when a voltage arising from such a charge accumulation) is present at the output node 125.

For example, in a charged device model (CDM) test, a voltage source may be connected to a resistor having a large resistance value (e.g., >10 MΩ) in contact with a fixture coupled to the DUT after which one or more pins of the DUT are grounded. Such DUTs may be characterized by the peak voltage applied in accordance with the CDM, or a resulting peak current level. As an example, an applied voltage of 500 V may result in a peak current of ~6A over nanosecond time scales. The ESD-endurance of the circuit block 180 may be tested by applying a voltage in accordance with a suitable CDM model to the input node 184 of the circuit block 180 and/or to the output node 125 of the circuit block 120. In the example of FIG. 1A, the circuit block 180 is provided with conventional ESD protection circuitry (often referred to as "local CDM protection", "internal CDM protection", or a "local CDM clamp.") that includes the series resistor 150 disposed between the output node 125 of the circuit block 120 and the input node 184 of the circuit block 180; and the p-channel transistor 162 and the n-channel transistor 164. Together, these devices form internal CDM clamp circuitry 140 (as shown in FIG. 1B) configured to allow ESD currents driven by charge accumulation at the output node 125 of the circuit block 120 to be dissipated via the supply voltage line 181 or the reference voltage line 183 without damaging device structures coupled to the input node 184 of the circuit block 180 (e.g., transistor gate dielectrics).

Highly-scaled transistor logic devices may be fabricated using transistors with threshold voltages near or below one Volt. Depending on the intended operating voltages at the gates of such transistors, the gate dielectrics may be rated to withstand voltages in an approximate range of 1-5 Volts, as a non-limiting example. The gate oxide of a transistor may be able to withstand significantly higher voltages over short timescales associated with ESD events. For example, a transistor gate dielectric may withstand 4-5 times its nominal voltage endurance rating for pulses with durations of approximately 1 nanosecond.

The internal CDM clamp circuitry 140 consists of at least two parts: the resistor 150, and one or more local clamp devices (the transistor 162 and the transistor 164 in this example). The local clamp devices draw a small amount of current through the resistor 150 during a CDM-type ESD event. The resulting voltage drop across the resistor 150 shields the gate dielectric coupled to the input node 184 of the circuit block 180 from overvoltage damage during the ESD event. The output node 125 of the circuit block 120 needs no such protection during a CDM-type ESD event originating at the output node 125 because the output of any inverter contains two parasitic diodes: one from the reference voltage line to the output node (e.g., from the reference voltage line 123 to the output node 125), and one from the output node to the supply voltage node (e.g., from the output node 125 to the supply voltage line 121), which act as local protection devices coupled to the output node 125 of the circuit block 120. It will be understood that the transistors pictured are examples of suitable clamp devices but that other devices may be used such as appropriate configured diodes, and the like.

While the ESD protection circuitry shown in FIG. 1A may provide adequate ESD protection in some applications, such conventional approaches have disadvantages which may be understood from FIG. 1B which shows a schematic plan view of the example IC 100. In FIG. 1B, the footprints of the active areas of transistors are represented by unfilled rectangles with solid boundaries. The footprints of polysilicon transistor gates and other polysilicon elements are represented by hatched rectangles. Additional dashed rectangles surrounding some of the elements shown represent the footprint of areas requiring additional lithographic fabrication steps as discussed further below.

Either of both of the circuit blocks 120, 180 may be a digital logic block. High-performance digital logic circuits may rely on highly-scaled transistor designs with nanometer-scale critical dimensions. Circuit designers must frequently rely on restrictive design rules to ensure that such highly-scaled components can be manufactured reliably. Such design rules may impose symmetry and other requirements on the placement and design of transistors and other components. For instance, as semiconductor technology nodes have advanced, many lithographic patterning schemes for highly-scaled transistors have come to require repetitive arrangements of transistor gates with regular spacings, as a non-limiting example. Some design rules even prescribe the use of dummy transistor gates in wafer areas where no functional gates are needed in order to maintain a desired periodicity of gates and/or a desired overall symmetry. The integration of conventional polysilicon resistors will necessarily interrupt any regular pattern of gates required by the design rules for various circuit blocks.

Thus, the use of a polysilicon resistor as the resistor 150 may have at least two disadvantages. First, as shown in FIG. 1B, the resistor 150 may require a significant amount of physical space on a die in order to achieve a suitable resistance value. Next, design rules may specify minimum distances between the resistor 150 and other elements of the internal CDM clamp circuitry 140 and one or both of the circuit blocks 120, 180. For example, in FIG. 1B, the area reserved for the internal CDM clamp 140 is shown with additional setback areas to ensure adequate physical separation from the circuit blocks 120, 180 which may be specified by the design rules. In addition the internal CDM clamp circuitry 140 may include additional elements such as the smaller polysilicon pull-up and pull-down resistors 142, 144 shown in FIG. 1B. It will be appreciated that the area occupied by the internal CDM clamp circuitry 140 and accompanying setbacks dictated by design rules may be significantly larger than the physical extent of the individual elements of the internal CDM clamp circuitry 140 alone. Thus, the IC 100 may require significant area on a wafer, resulting in increased unit costs. Furthermore, an IC may require tens are hundreds of internal CDM clamps (or more), depending on the size and complexity of the IC. Thus, ESD protection schemes that address the shortcomings of silicon resistors and/or metal resistors needed for each internal CDM clamp may result in highly-desirable improvements in IC density.

In addition, elements of conventional ESD protection circuitry such as the internal CDM clamp 140 are often fabricated using a silicide process in which device structures are covered by a so-called resist-protective oxide ("RPO"). This RPO is then lithographically patterned to create areas where the RPO is removed so that silicided areas can be formed to provide improved electrical contact for contact plugs, vias, or other electrodes, and to leave complementary areas where silicide formation is suppressed. The dashed rectangles over portions of the internal CDM clamp circuitry 140 indicate typical areas where silicide formation is suppressed following patterning of RPO. Such additional lithographic patterning steps can introduce undesired additional manufacturing complexity.

An ESD protection scheme according to embodiments herein that addresses disadvantages of internal CDM clamps that use resistors such as the resistor 150 is illustrated by the circuit diagram of an example IC 200 (e.g., the IC 100) shown in FIG. 2A. The IC 200 has two circuit blocks 220, 280 (e.g., circuit blocks 120, 180). Each of the circuit blocks 220, 280 has a respective supply voltage line (supply voltage lines 221, 281), a respective reference voltage line (reference voltage lines 223, 283) as well as respective input nodes 224, 284 and respective output nodes 125, 185. The reference voltage line 223 of the circuit block 220 is separated from the reference voltage line 283 of the circuit block 280 by antiparallel diodes 235 (e.g., antiparallel diodes 135). Ground domains may have differing degrees of capacitive coupling to a ground of a semiconductor package (which may become an earth ground). As shown, the ground domain of the circuit block 220 is capacitively coupled relatively strongly to such a ground, as represented by the large capacitor 228 between the reference voltage line 223 and ground. Meanwhile, the ground domain of the circuit block 280 may be relatively weakly capacitively coupled to ground as indicated by the smaller capacitor 288 between the reference voltage line 283 and ground (e.g., the ground domain of the circuit block 280 may be configured to be relatively isolated from any package or earth ground connection).

In the IC 200, the resistor 150 between the output node 125 of the first circuit block 120 and the input node 184 of the second circuit block 180 is replaced with the complementary pass gate 250, as shown in FIG. 2A, disposed between the output node 285 of the circuit block 220 and the input node 284 of the circuit block 280. In the example IC 200, the pass-gate 250 is formed by the parallel combination of one or more n-channel transistors 250$n$ with one or more p-channel transistors 250$p$. Electrically, the pass-gate 250 acts as a resistor; when supply voltage line 281 (coupled to the supply domain of the circuit block 280) the pass-gate 250 provides a conductive path between the output node 225 of the circuit block 220 and the input node 284 of the circuit block 280 and this path has a resistance determined by the channel resistance of the pass-gate 250, which can serve the same function as the resistor 150 in the IC 100.

In the IC 200, the pass-gate 250 is appropriately biased by the p-channel transistor 242 and the n-channel transistor 244 arranged as shown to act as a tie-high/tie-low cell when the circuit block 280 receives power via the supply voltage line 281. Under these circumstances, the channel resistance of the pass-gate 250 is configured to allow ESD-driven currents to be dissipated through the p-channel transistor 262 or the n-channel transistor 264 while ensuring that the voltage between the input node 284 relative to the reference voltage line 283 remains below a threshold voltage for damage to device structures coupled to the input node 284 (e.g., the input gate dielectric) of the circuit block 280. When no power is supplied to the IC 200 (i.e., no power is supplied to the supply voltage line 281), the effective resistance of the pass-gate 250 increases, increasing the level of protection provided against CDM-type ESD events at the input node 284 of the circuit block 280.

In one or more embodiments, the circuit block 280 is constructed using a transistor logic architecture (such e.g., NMOS, PMOS, or CMOS as non-limiting examples). In one or more such embodiments, the circuit block 280 includes a set of n-channel transistors, each of which is characterized by a corresponding set of n-channel transistor characteristics and the pass-gate includes one or more n-channel transistors which are also characterized by the same set of transistor characteristics as the set of n-channel transistors included in the circuit block 280. In other words, the n-channel transistor(s) 250$n$ of the pass-gate 250 may be substantially identical (i.e., to within manufacturing tolerances) to each transistor of the set of n-channel transistors included in the circuit block 280. In one or more embodiments the circuit block 280 includes a set of p-channel transistors, each of which is characterized by a corresponding set of p-channel transistor characteristics and the pass-gate 250 includes one or more p-channel transistors which are also characterized by the same set of transistor p-channel characteristics. In other words, the p-channel transistor(s) 250$p$ of the pass-gate 250 may be substantially identical (i.e., to within manufacturing tolerances) to each transistor of the set of p-channel transistors included in the circuit block 280.

It will be understood that non-limiting examples of suitable transistor characteristics include dimensions of suitable portions of the transistors such as gate length, gate width, gate area, gate oxide thickness, doping concentrations, doping profiles, and the like. For instance, a set of n-channel transistors may be substantially identical with respect to characteristics such as one or more device dimensions, doping profiles of a source wells, drain wells, channel doping profiles, a minimum feature size (MFS), a gate width, and so on. Similarly, a set of p-channel transistors may be substantially identical with respect to characteristics such as one or more device dimensions, doping profiles of a source wells, drain wells, channel doping profiles, a minimum feature size (MFS), a gate width, and so on. It will be appreciated that, in a CMOS device in which the n-channel transistors are substantially identical to each other and the p-channel transistors are substantially identical to each other, that the n-channel transistors need not be identical to the p-channel transistors.

It will be appreciated that, in embodiments where a pass-gate such as the pass-gate 250 is formed using identical transistors as the circuit block 280, that the pass-gate and elements of the internal CDM clamp circuitry 240 may be constructed directly adjacent to (or within) areas of a semiconductor die reserved for the circuit block 280 or any other circuit block(s) without violating design rules associated with fabrication and placement of those circuit blocks (e.g., one or both of the circuit blocks 220, 280 of the IC 200). For instance, in or more embodiments, the internal CDM clamp circuitry 240 is configured such that a periodic or otherwise regular pattern of transistor gate structures is jointly formed by the internal CDM clamp circuitry 240 (or portions thereof) and one or more neighboring circuit blocks (e.g., one or both of the circuit blocks 220, 280).

In or more embodiments, an internal CDM clamp (e.g., the internal CDM clamp 240) is configured to ensure that the voltage experienced across sensitive structures (e.g., transistor gate dielectrics) of devices coupled to an input node of a circuit block protected by the CDM clamp (e.g., the input signal node 284 of the circuit block 280) does not exceed a nominal "safe" voltage during an anticipated ESD event. For instance, in one or more embodiments, the internal CDM clamp circuitry 240 or similar circuitry is configured to ensure that the voltage at the input signal node 284 or a similar input signal node does not exceed a predetermined threshold voltage in a range of approximately 1-5V or any other suitable voltage range determined based on transistor dimensions, transistor doping profiles, material characteristics (e.g., material properties of transistor gate dielectric materials).

It will be appreciated that the use of a pass-gate such as the pass-gate 250 in ICs such as the IC 200 and other ICs can confer additional advantages. For example, some conventional design rules for ESD compatibility prohibit coupling transistor gates (e.g., the gates of clamp transistors such as the transistors 262, 264) directly to supply voltage lines (e.g., the supply voltage line 281) or reference voltage lines (e.g., the reference voltage line 283). In conventional designs, resistors may be connected between such supply and reference voltage lines and transistor gates. However, in the IC 200, the channel resistances of a transistor-based tie-high/tie-low cell (i.e., the transistors 242, 244) can be used in place of polysilicon, metal, or other resistor structures (and the accompanying area die area penalties associated with the use of such structures when design rules requiring these elements to be physically separated from the circuits they are used to protect). As discussed above, the substitution of transistors that are compatible with design rules for the surrounding circuitry in place of polysilicon resistors may result in smaller die sizes due to the elimination of set-offs between the resistors and the nearby transistor circuitry and because the area required for one or more transistors may be significantly smaller than the area required for suitable polysilicon (or other) resistors. In addition, the pass-gate 250 may be configured to have a channel resistance configured to produce a large enough voltage drop in response to currents driven by CDM-type ESD events such that the transistors 242, 244 may not need to be as robust as the transistors 142, 144. As shown, this may eliminate the need to use a silicide process described above in connection with other CDM clamp circuitry (e.g., the internal CDM clamp circuitry 140, as shown in FIG. 1B).

Figure 2B:
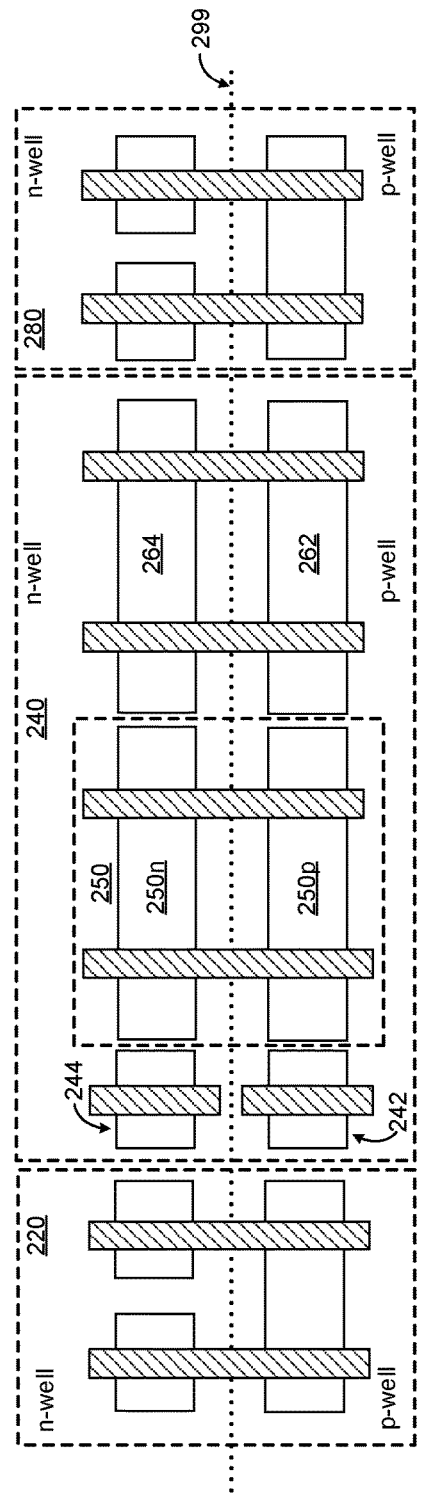
FIG. 2B shows a schematic plan view illustration of the integrated circuit of FIG. 2A.

FIG. 2B is a schematic plan view of the IC 200 according to an example embodiment in which the circuit blocks 220, 280 are represented by simplified groupings of transistors. As shown, the IC 200 is separated into portions above the dotted line 299 reserved for n-channel transistors and portions below the dotted line reserved for p-channel transistors. As shown, the die area for the internal CDM clamp circuitry 240 (the tie-high/tie-low transistors 242, 244, the complementary pass-gate 250, and the clamping transistors 262, 264) directly abuts the areas for the circuit blocks 220, 280. In the example of FIG. 2B, the use of the complementary pass-gate 250 (with transistors 250n, 250p) allows the use of similar or identical transistors to those used in adjacent digital logic circuit blocks without upsetting various common design rules for advanced digital logic devices. For instance, the n-type transistors 244, 250n, 264 are positioned in the area reserved for n-type transistors above the dashed line 299 and the p-type transistors 242, 250p, 262 are positioned in the area reserved for p-type transistors below the dashed line 299. In addition, similar or identical transistor types may be used for the transistors of the internal CDM clamp circuitry 240 and the circuit blocks 220, 280. Thus, internal CDM clamp circuitry according to embodiment herein (e.g., the internal CDM clamp circuitry 240 or related circuitry) can be placed directly adjacent to both circuit blocks 220, 280 without creating an irregular arrangement of transistor gates (which is forbidden by some design rules and would otherwise necessitate offsetting the internal CDM clamp circuitry from other circuit blocks (e.g., the circuit blocks 120, 180 as illustrated in FIG. 1B with respect to the internal CDM clamp circuitry 140).

It will be understood that one or more embodiments may omit certain structures of the IC 200 as shown in FIG. 2A and/or replace those structures with other structures. For instance, it will be understood that the transistors 262, 264 are non-limiting examples of suitable clamp devices configured to shunt ESD-driven currents away from the input node 284 and that any suitable devices can be used. In or more embodiments, one or both of the transistors 262, 264 is replaced by an appropriately configured diode. In or more embodiments, one or both of the transistors 262, 264 is replaced by a transistor configured such the clamp device functionality is provided a parasitic diode of that transistor. Additional embodiments related to the embodiment of FIG. 2 are described below with reference to FIGS. 3-6.

Figure 3:
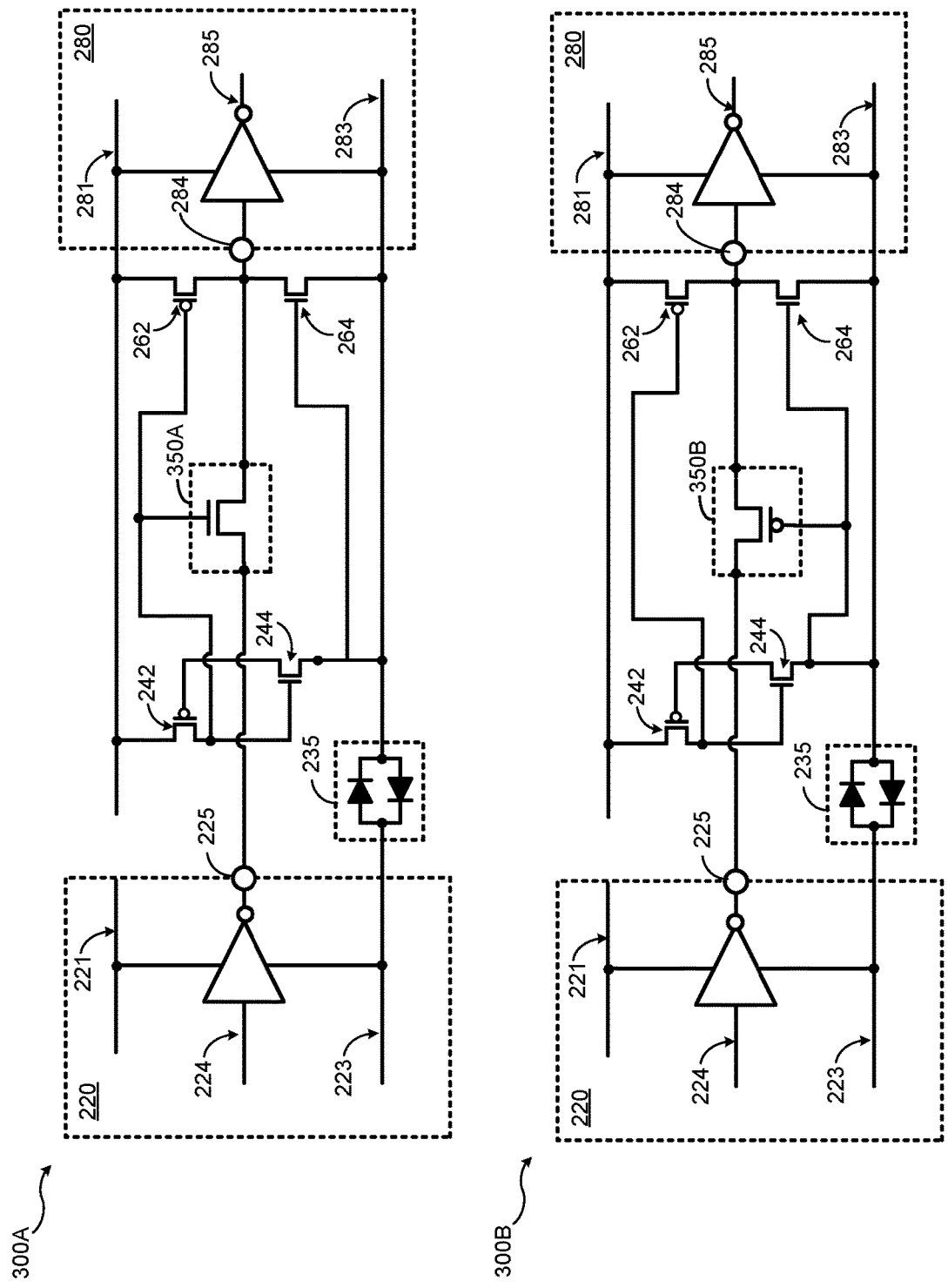
FIG. 3 shows circuit diagrams of two other example ICs in which CDM clamp circuitry includes a transistor pass-gate connected between an output node of a first circuit block and an input node of second circuit block according to embodiments herein.

FIG. 3 shows circuit diagrams example ICs 300A, 300B in which a unipolar pass gate is used instead of a complementary pass-gate (e.g., the pass-gate 250), according to one or more embodiments. As shown, the example IC 300A is equivalent to the IC 200 if the complementary pass-gate 250 is replaced by a single n-channel transistor configured as a pass-gate 350A. Similarly, the example IC 300B is equivalent to the IC 200 if the complementary pass-gate 250 is replaced by a single p-channel transistor configured as a pass-gate 350B.

Figure 4:
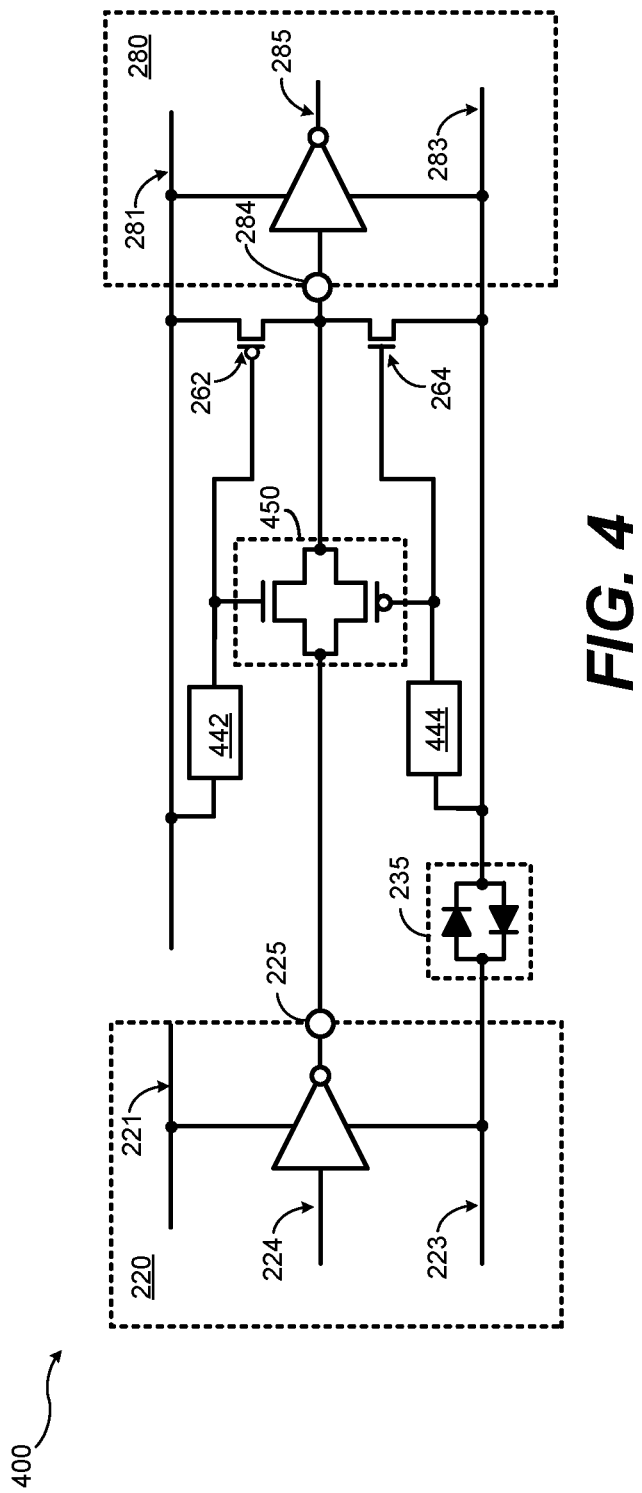
FIG. 4 shows a circuit diagram of another example IC in which CDM clamp circuitry includes a transistor pass-gate connected between an output node of a first circuit block and an input node of second circuit block according to embodiments herein.

Along similar lines, FIG. 4 is a circuit diagram of an example IC 400 that is equivalent to the example IC 200 with the transistor-based tie-high/tie-low circuitry (e.g., the transistors 242, 244) replaced, according to one or more embodiments, with a pull-up resistor 442 and a pull-down resistor 444 coupled to respective gates of a complementary transistor pass-gate 450 (e.g., the pass-gate 250) and to the respective gates of the transistors 262, 264.

Figure 5:
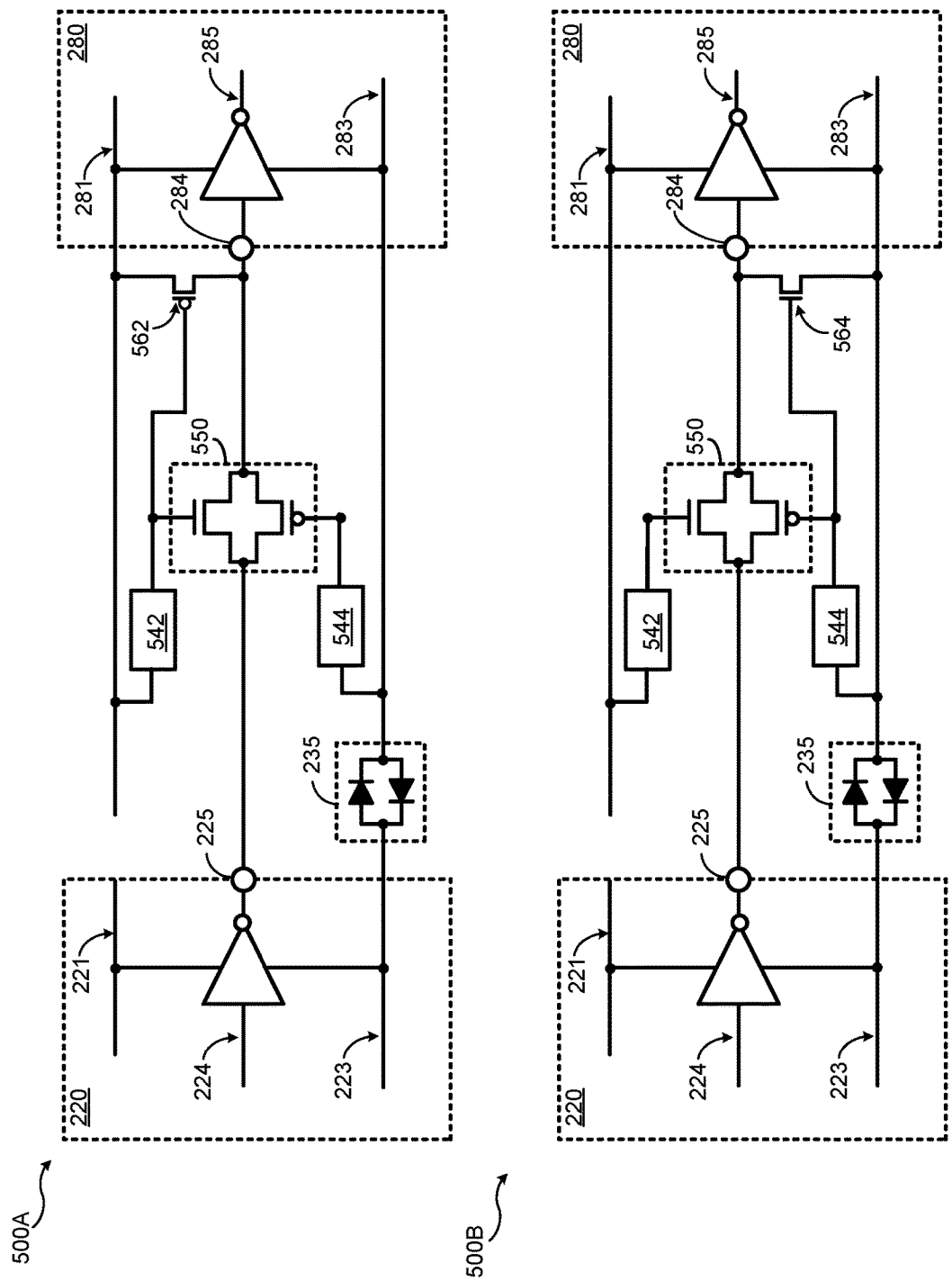
FIG. 5 shows circuit diagrams of two other example ICs in which CDM clamp circuitry includes a transistor pass-gate connected between an output node of a first circuit block and an input node of second circuit block according to embodiments herein.

FIG. 5 shows circuit diagrams of example ICs 500A, 500B in which with the transistor-based tie-high/tie-low circuitry of the example IC 200 (e.g., the transistors 242, 244) replaced, according to one or more embodiments, with a pull-up resistor 542 (e.g., the pull-up resistor 442) and a pull-down resistor 544 (e.g., the pull-down resistor 444) coupled to respective gates of a complementary transistor pass-gate 550 (e.g., a pass-gate 250, 450). The example IC 500A features a single p-channel transistor 562 (e.g., a transistor 262) connected between the supply voltage line 281 and the input node 284 of the circuit block 280 with its gate coupled to the pull-up resistor 542, according to one or more embodiments. The example IC 500B features a single n-channel transistor 564 (e.g., a transistor 264) connected between the input node 284 and the reference voltage line 283 of the circuit block 280 that has its gate coupled to the pull-up resistor 544, according to one or more embodiments.

Figure 6:
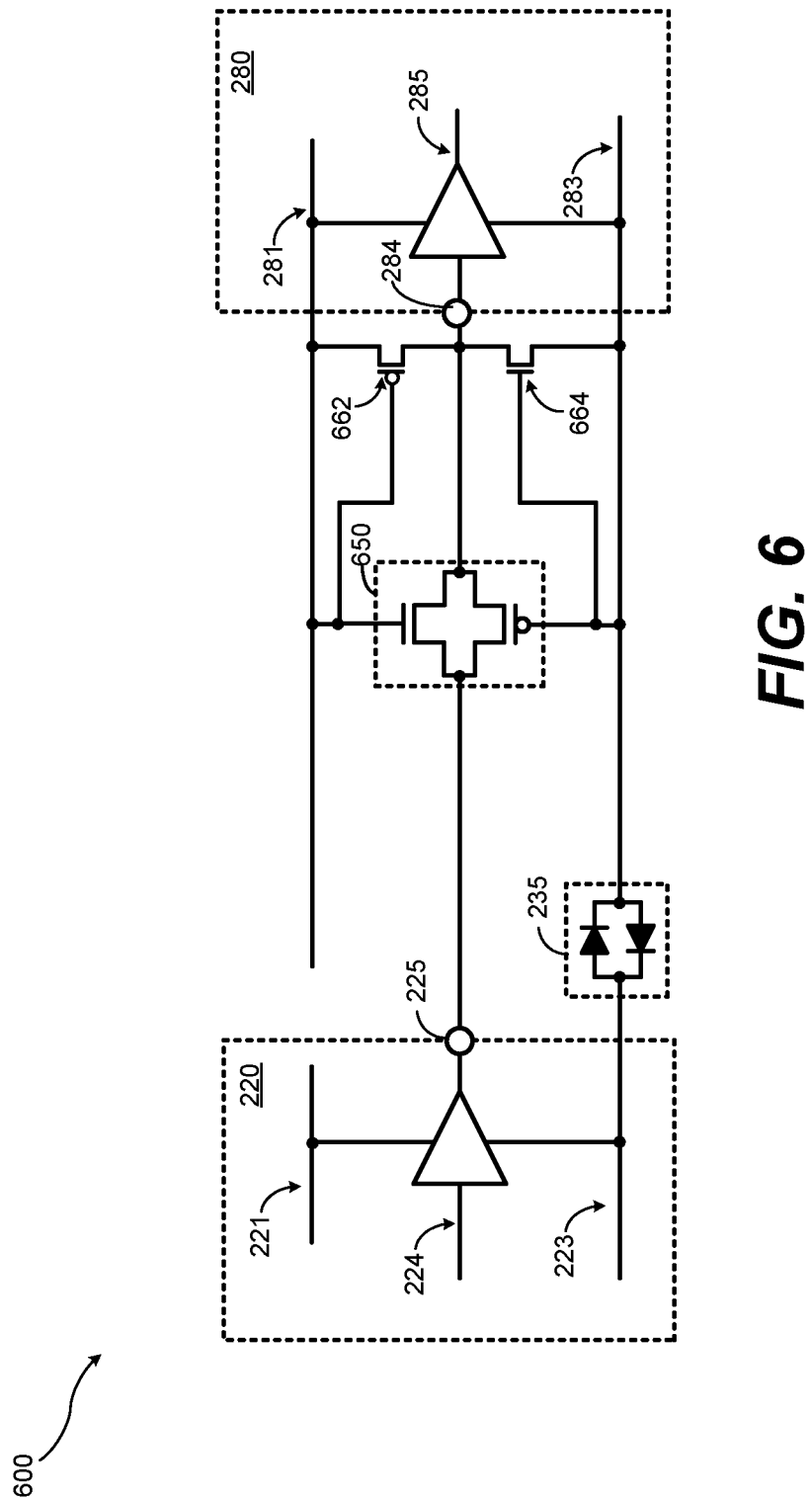
FIG. 6 shows a circuit diagram of another example IC in which CDM clamp circuitry includes a transistor pass-gate connected between an output node of a first circuit block and an input node of second circuit block according to embodiments herein.

FIG. 6 is a circuit diagram of an example IC 600A in which respective gates of a complementary pass-gate 650 (e.g., a pass-gate 250, 450, 550) are tied directly to the supply voltage line 281 and the reference voltage line 283, according to one or more embodiments. The IC 600 includes a p-channel transistor 662 (e.g., a transistor 262, 562) coupled between the supply voltage line 281 and the input node 284 of the circuit block 280 that has its gate tied directly to the supply voltage line 281. The example IC 600 also includes an n-channel transistor 664 (e.g., a transistor 264, 564) connected between the input node 284 and the reference voltage line 283 of the circuit block 280 that has its gate coupled directly to the reference voltage line 283 of the circuit block 280, according to one or more embodiments.

Features of embodiments may be understood by way of one or more of the following examples:

Example 1: A semiconductor device that includes a semiconductor substrate, a first circuit block formed within the semiconductor substrate, and a second circuit block formed within the semiconductor substrate. The first circuit block has an output node and includes first electronic devices coupled to a first supply voltage node formed within the semiconductor substrate and a first reference voltage node formed within the semiconductor substrate. The second circuit block has an input node coupled to the output node of the first circuit block and includes second electronic devices coupled to a second supply voltage node formed within the semiconductor substrate and a second reference voltage node formed within the semiconductor substrate that is separated from the first reference voltage node.

The device also includes a transistor pass gate formed within the semiconductor substrate having first and second current terminals. The pass gate is coupled between the output node of the first circuit block and the input node of the second circuit block. The first current terminal of the pass gate is coupled to the output node of the first circuit block and the second current terminal of the pass gate is coupled to the input node of the second circuit block.

The pass gate is configured to provide a resistive path between the first current terminal and the second current terminal such that, when an amount of charge sufficient to cause an electrostatic discharge (ESD) event accumulates at the output node of the first circuit block, an electric potential difference between the input node of the second circuit block and the second reference voltage node of the second circuit block does not exceed a first predetermined threshold voltage.

Example 2: The semiconductor device of Example 1, further including a clamp device formed within the semiconductor substrate and coupled to the input node of the second circuit block. In this Example, the clamp device is configured to shunt ESD-induced current from the input node of the second circuit block to the second reference voltage node or the second supply voltage node when an electrical potential difference between the input node of the second circuit block and the second reference voltage node exceeds a second predetermined threshold voltage that is less than the first predetermined threshold voltage.

Example 3: The semiconductor device Example 1 or Example 2, in which the pass gate includes a p-channel transistor having a control terminal that is electrically coupled to the second supply voltage node.

Example 4: The semiconductor device of any of Example 3, in where the control terminal of the p-channel transistor is coupled to the second supply voltage node via a pull-up resistor formed within the semiconductor substrate.

Example 5: The semiconductor device of Example 3, in which the control terminal of the p-channel transistor is coupled to the second supply voltage node via a tie-high transistor circuit formed within the semiconductor substrate.

Example 6: The semiconductor device of any of Examples 1-5 in which the pass gate includes an n-channel transistor having a control terminal that is electrically coupled to the second reference voltage node.

Example 7: The semiconductor device of Example 6, in which the control terminal of the n-channel transistor of the pass gate is coupled to the second reference voltage node via a pull-down resistor formed within the semiconductor substrate.

Example 8: The semiconductor device of Example 6, in which the control terminal of the n-channel transistor of the pass gate is coupled to the second reference voltage node via a tie-low transistor circuit.

Example 9: The semiconductor device of any of Examples 1-8, in which the pass gate includes a p-channel transistor having a control terminal that is electrically coupled to the second supply voltage node. In this Example, the pass gate includes an n-channel transistor having a control terminal that is electrically coupled to the second reference voltage node and the p-channel transistor of the pass gate is connected in parallel with the n-channel transistor in between the first current terminal and the second current terminal of the pass gate.

Example 10: The semiconductor device of any of Examples 1-9, in which the second circuit block includes digital logic circuitry having a first set of transistors of a first conduction type. Each transistor of the first set of transistors is defined by a first set of transistor characteristics. In this Example, the pass gate includes a second set of transistors of the first conduction type that are also defined by the first set of transistor characteristics.

Example 11: The semiconductor device of any of Examples 1-10, in which the second circuit block includes digital logic circuitry that includes a first set of n-channel transistors, each of which is defined by a first set of transistor characteristics; and a first set of p-channel transistors, each of which is defined by a second set of transistor characteristics. In this Example, the pass gate includes a second set of n-channel transistors, each of which is also defined by the first set of transistor characteristics and a second set of p-channel transistors, each of which is also defined by the second set of transistor characteristics.

Example 12: A method of fabricating a semiconductor device that includes forming a transistor pass gate within a semiconductor substrate. The pass gate has first and second current terminals. The method further includes electrically coupling the first current terminal of the pass gate to an output node of a first circuit block formed within the semiconductor substrate; electrically coupling the second current terminal of the pass gate to the input node of a second circuit block formed within the semiconductor substrate.

The first circuit block includes first electronic devices coupled to a first supply voltage node formed within the semiconductor substrate and a first reference voltage node formed within the semiconductor substrate. The input node of the second circuit block is coupled to the output node of the first circuit block via the pass gate.

The second circuit block includes second electronic devices coupled to a second supply voltage node formed within the semiconductor substrate and a second reference voltage node formed within the semiconductor substrate that is separated from the first reference voltage node.

The pass gate is configured to provide a resistive path between the first current terminal and the second current terminal such that, when an amount of charge sufficient to cause an electrostatic discharge (ESD) event accumulates at the output node of the first circuit block, an electric potential difference between the input node of the second circuit block and the second reference voltage node of the second circuit block does not exceed a first predetermined threshold voltage.

Example 13: The method of Example 12, in which the semiconductor device includes a clamp device formed within the semiconductor substrate coupled to the input node of the second circuit block. In this Example, the clamp device is configured to shunt ESD-induced current from the input node of the second circuit block to the second reference voltage node or the second supply voltage node when an electrical potential difference between the input node of the second circuit block and the second reference voltage node exceeds a second predetermined threshold voltage that is less than the first predetermined threshold voltage.

Example 14: The method of Example 12 or Example 13 in which forming the pass gate includes forming a p-channel transistor within the semiconductor substrate. The method further includes electrically coupling a control terminal of the p-channel transistor to the second supply voltage node.

Example 15: The method of Example 14, further including electrically coupling the control terminal of the p-channel transistor is coupled to the second supply voltage node via a polysilicon pull-up resistor formed within the semiconductor substrate.

Example 16: The method of Example 14, further including electrically coupling the control terminal of the p-channel transistor is coupled to the second supply voltage node via a tie-high transistor circuit formed within the semiconductor substrate.

Example 17: The method of any of Examples 12-16, in which forming the pass gate includes forming an n-channel transistor within the semiconductor substrate and further including electrically coupling a control terminal of the n-channel transistor to the second reference voltage node.

Example 18: The method of Example 17, further including electrically coupling the control terminal of the n-channel transistor to the second reference voltage node via a pull-down resistor formed within the semiconductor substrate.

Example 19: The method of Example 17, further including electrically coupling the control terminal of the n-channel transistor to the second reference voltage node via a tie-low transistor circuit formed within the semiconductor substrate.

Example 20: The method of any of Examples 12-19, in which a p-channel transistor of the pass gate is connected in parallel with an n-channel transistor of the pass gate in between the first current terminal and the second current terminal of the pass gate.

Example 21: The method of any of Examples 12-20, in which the second circuit block includes digital logic circuitry that includes a first set of transistors of a first conduction type. Each transistor of the first set of transistors is defined by a first set of transistor characteristics. This Example further includes forming, as part of the pass gate, a second set of transistors of the first conduction type within the semiconductor substrate that are also defined by the first set of transistor characteristics.

Example 22: The method of any of Examples 12-21, in which the second circuit block includes digital logic circuitry that includes a first set of n-channel transistors, each of which is defined by a first set of transistor characteristics; and a first set of p-channel transistors, each of which is defined by a second set of transistor characteristics. The example further includes forming, as parts of the pass gate: a second set of n-channel transistors, each of which is also defined by the first set of transistor characteristics; and a second set of p-channel transistors each of which, is also defined by the second set of transistor characteristics.

The preceding detailed description and examples are merely illustrative in nature and are not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

It should be understood that this invention is not limited in its application to the details of construction and the arrangement of components set forth in the preceding description or illustrated in the accompanying drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The preceding discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The preceding detailed description is to be read with reference to the figures, in which like elements in different figures have like reference numerals. The Figures, which are not necessarily to scale, depict selected embodiments and are not intended to limit the scope of embodiments of the invention. Skilled artisans will recognize the examples provided herein have many useful alternatives and fall within the scope of embodiments of the invention.

The connecting lines shown in the various figures contained herein are intended to represent example functional relationships and/or physical couplings between the various elements. It should be noted that many alternative or additional functional relationships or physical connections may be present in one or more embodiments of the subject matter. In addition, certain terminology may also be used herein for the purpose of reference only, and thus are not intended to be limiting, and the terms "first," "second" and other such numerical terms referring to structures do not imply a sequence or order unless clearly indicated by the context.

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one example arrangement of elements, additional intervening elements, devices, features, or components may be present in one or more embodiments of the depicted subject matter.

What is claimed is:

1. A semiconductor device, comprising:
 a semiconductor substrate
 a first circuit block formed within the semiconductor substrate having an output node, the first circuit block including first electronic devices coupled to a first supply voltage node formed within the semiconductor substrate and a first reference voltage node formed within the semiconductor substrate;
 a second circuit block formed within the semiconductor substrate having an input node coupled to the output node of the first circuit block, the second circuit block including second electronic devices coupled to a second supply voltage node formed within the semiconductor substrate and a second reference voltage node formed within the semiconductor substrate that is separated from the first reference voltage node;
 a transistor pass gate formed within the semiconductor substrate having first and second current terminals; and
 a clamp device formed within the semiconductor substrate and coupled to the input node of the second circuit block;
 wherein the first current terminal of the pass gate is coupled to the output node of the first circuit block; the second current terminal of the pass gate is coupled to the input node of the second circuit block; and the output node of the first circuit block is coupled to the input node of the second circuit block via the pass gate;

wherein the pass gate is configured to provide a resistive path between the first current terminal and the second current terminal such that, when an amount of charge sufficient to cause an electrostatic discharge (ESD) event accumulates at the output node of the first circuit block, an electric potential difference between the input node of the second circuit block and the second reference voltage node of the second circuit block does not exceed a first predetermined threshold voltage; and wherein the clamp device is configured to shunt ESD-induced current from the input node of the second circuit block to the second reference voltage node or the second supply voltage node when an electrical potential difference between the input node of the second circuit block and the second reference voltage node exceeds a second predetermined threshold voltage that is less than the first predetermined threshold voltage; and wherein the pass gate includes:
    a p-channel transistor having a control terminal that is electrically coupled to the second supply voltage node via a pull-up resistor formed within the semiconductor substrate or via a tie-high transistor circuit formed within the semiconductor substrate; or
    an n-channel transistor having a control terminal that is electrically coupled to the second reference voltage node via a pull-down resistor formed within the semiconductor substrate or via a tie-low transistor circuit formed within the semiconductor substrate.

2. The semiconductor device of claim 1,
wherein the pass gate includes the p-channel transistor having a control terminal that is electrically coupled to the second supply voltage node.

3. The semiconductor device of claim 2, wherein the control terminal of the p-channel transistor is coupled to the second supply voltage node via the pull-up resistor formed within the semiconductor substrate.

4. The semiconductor device of claim 2, wherein the control terminal of the p-channel transistor is coupled to the second supply voltage node via the tie-high transistor circuit formed within the semiconductor substrate.

5. The semiconductor device of claim 1,
wherein the pass gate includes an n-channel transistor having a control terminal that is electrically coupled to the second reference voltage node.

6. The semiconductor device of claim 5, wherein the control terminal of the n-channel transistor of the pass gate is coupled to the second reference voltage node via the pull-down resistor formed within the semiconductor substrate.

7. The semiconductor device of claim 5, wherein the control terminal of the n-channel transistor of the pass gate is coupled to the second reference voltage node via the tie-low transistor circuit formed within the semiconductor substrate.

8. The semiconductor device of claim 1,
wherein the pass gate includes the p-channel transistor having a control terminal that is electrically coupled to the second supply voltage node; and
wherein the pass gate also includes the n-channel transistor having a control terminal that is electrically coupled to the second reference voltage node; and wherein the p-channel transistor of the pass gate is connected in parallel with the n-channel transistor in between the first current terminal and the second current terminal of the pass gate.

9. A semiconductor device, comprising:
a semiconductor substrate
a first circuit block formed within the semiconductor substrate having an output node, the first circuit block including first electronic devices coupled to a first supply voltage node formed within the semiconductor substrate and a first reference voltage node formed within the semiconductor substrate;
a second circuit block formed within the semiconductor substrate having an input node coupled to the output node of the first circuit block, the second circuit block including second electronic devices coupled to a second supply voltage node formed within the semiconductor substrate and a second reference voltage node formed within the semiconductor substrate that is separated from the first reference voltage node;
a transistor pass gate formed within the semiconductor substrate having first and second current terminals; and
a clamp device formed within the semiconductor substrate and coupled to the input node of the second circuit block;

wherein the first current terminal of the pass gate is coupled to the output node of the first circuit block; the second current terminal of the pass gate is coupled to the input node of the second circuit block; and the output node of the first circuit block is coupled to the input node of the second circuit block via the pass gate;

wherein the pass gate is configured to provide a resistive path between the first current terminal and the second current terminal such that, when an amount of charge sufficient to cause an electrostatic discharge (ESD) event accumulates at the output node of the first circuit block, an electric potential difference between the input node of the second circuit block and the second reference voltage node of the second circuit block does not exceed a first predetermined threshold voltage;

wherein the clamp device is configured to shunt ESD-induced current from the input node of the second circuit block to the second reference voltage node or the second supply voltage node when an electrical potential difference between the input node of the second circuit block and the second reference voltage node exceeds a second predetermined threshold voltage that is less than the first predetermined threshold voltage;

wherein the second circuit block includes digital logic circuitry having a first set of transistors of a first conduction type, wherein each transistor of the first set of transistors is defined by a first set of transistor characteristics; and wherein the pass gate includes a second set of transistors of the first conduction type that are also defined by the first set of transistor characteristics.

10. The semiconductor device of claim 9,
wherein the first set of transistors of the first conduction type is a set of n-channel transistors and the second set of transistors of the first conduction type is also set of n-channel transistors; and
wherein the digital logic circuitry of the second circuit block further comprises a first set of p-channel transistors, each of which is defined by a second set of transistor characteristics; and
wherein the pass gate further includes:

a second set of p-channel transistors, each of which is also defined by the second set of transistor characteristics.

11. A method of fabricating a semiconductor device, the method comprising:
forming a transistor pass gate having first and second current terminals within a semiconductor substrate;
electrically coupling the first current terminal of the pass gate to an output node of a first circuit block formed within the semiconductor substrate;
electrically coupling the second current terminal of the pass gate to an input node of a second circuit block formed within the semiconductor substrate; and
forming a clamp device within the semiconductor substrate that is coupled to the input node of the second circuit block;
wherein the first circuit block includes first electronic devices coupled to a first supply voltage node formed within the semiconductor substrate and a first reference voltage node formed within the semiconductor substrate;
wherein the input node of the second circuit block is coupled to the output node of the first circuit block via the pass gate and the second circuit block includes second electronic devices coupled to a second supply voltage node formed within the semiconductor substrate and a second reference voltage node formed within the semiconductor substrate that is separated from the first reference voltage node;
wherein the pass gate is configured to provide a resistive path between the first current terminal and the second current terminal such that, when an amount of charge sufficient to cause an electrostatic discharge (ESD) event accumulates at the output node of the first circuit block, an electric potential difference between the input node of the second circuit block and the second reference voltage node of the second circuit block does not exceed a first predetermined threshold voltage;
wherein the clamp device is configured to shunt ESD-induced current from the input node of the second circuit block to the second reference voltage node or the second supply voltage node when an electrical potential difference between the input node of the second circuit block and the second reference voltage node exceeds a second predetermined threshold voltage that is less than the first predetermined threshold voltage; and
wherein the forming the pass gate comprises:
forming a p-channel transistor within the semiconductor substrate and electrically coupling a control terminal of the p-channel transistor to the second supply voltage node via a polysilicon pull-up resistor formed within the semiconductor substrate or via a tie-high transistor circuit formed within the semiconductor substrate; or
forming an n-channel transistor within the semiconductor substrate and electrically coupling a control terminal of the n-channel transistor to the second reference voltage node via a polysilicon pull-down resistor formed within the semiconductor substrate or via a tie-low transistor circuit formed within the semiconductor substrate.

12. The method of claim 11,
wherein forming the pass gate includes forming the p-channel transistor within the semiconductor substrate; and
wherein the method further comprises electrically coupling the control terminal of the p-channel transistor to the second supply voltage node.

13. The method of claim 12, further comprising electrically coupling the control terminal of the p-channel transistor is coupled to the second supply voltage node via the polysilicon pull-up resistor formed within the semiconductor substrate.

14. The method of claim 12, further comprising electrically coupling the control terminal of the p-channel transistor is coupled to the second supply voltage node via the tie-high transistor circuit formed within the semiconductor substrate.

15. The method of claim 11,
wherein forming the pass gate includes forming the n-channel transistor within the semiconductor substrate; and
wherein the method further comprises electrically coupling the control terminal of the n-channel transistor to the second reference voltage node.

16. The method of claim 15, further comprising electrically coupling the control terminal of the n-channel transistor to the second reference voltage node via the pull-down resistor formed within the semiconductor substrate.

17. The method of claim 15, further comprising electrically coupling the control terminal of the n-channel transistor to the second reference voltage node via the tie-low transistor circuit formed within the semiconductor substrate.

18. The method of claim 11, wherein forming the pass gate comprises:
forming the p-channel transistor as part of the pass gate and electrically coupling the control terminal of the p-channel transistor to the second supply voltage node; and
forming the n-channel transistor as part of the pass gate and electrically coupling the control terminal of the n-channel transistor to the second reference voltage node; and
wherein the p-channel transistor is connected in parallel with the n-channel transistor in between the first current terminal and the second current terminal of the pass gate.

19. A method of forming a semiconductor device, comprising:
forming a transistor pass gate having first and second current terminals within a semiconductor substrate;
electrically coupling the first current terminal of the pass gate to an output node of a first circuit block formed within the semiconductor substrate;
electrically coupling the second current terminal of the pass gate to an input node of a second circuit block formed within the semiconductor substrate; and
forming a clamp device within the semiconductor substrate that is coupled to the input node of the second circuit block;
wherein the first circuit block includes first electronic devices coupled to a first supply voltage node formed within the semiconductor substrate and a first reference voltage node formed within the semiconductor substrate;
wherein the input node of the second circuit block is coupled to the output node of the first circuit block via the pass gate and the second circuit block includes second electronic devices coupled to a second supply voltage node formed within the semiconductor substrate and a second reference voltage node formed within the semiconductor substrate that is separated from the first reference voltage node;

wherein the pass gate is configured to provide a resistive path between the first current terminal and the second current terminal such that, when an amount of charge sufficient to cause an electrostatic discharge (ESD) event accumulates at the output node of the first circuit block, an electric potential difference between the input node of the second circuit block and the second reference voltage node of the second circuit block does not exceed a first predetermined threshold voltage;

wherein the clamp device is configured to shunt ESD-induced current from the input node of the second circuit block to the second reference voltage node or the second supply voltage node when an electrical potential difference between the input node of the second circuit block and the second reference voltage node exceeds a second predetermined threshold voltage that is less than the first predetermined threshold voltage;

wherein the second circuit block includes digital logic circuitry comprising a first set of transistors of a first conduction type, wherein each transistor of the first set of transistors is defined by a first set of transistor characteristics; and wherein the method further comprises forming, as part of the pass gate, a second set of transistors of the first conduction type within the semiconductor substrate that are also defined by the first set of transistor characteristics.

20. The method of claim 19, wherein the first set of transistors of the first conduction type is a first set of n-channel transistors, each of which is defined by a first set of transistor characteristics;

wherein the second circuit block further includes a first set of p-channel transistors, each of which is defined by a second set of transistor characteristics;

wherein the second set of transistors of the first conduction type is a second set of n-channel transistors, each of which is also defined by the first set of transistor characteristics; and wherein the method further comprises forming, as parts of the pass gate, a second set of p-channel transistors, each of which is also defined by the second set of transistor characteristics.

\* \* \* \* \*